United States Patent
Joh et al.

(10) Patent No.: US 11,637,510 B2
(45) Date of Patent: Apr. 25, 2023

(54) FUNNEL-SHAPED UNDERWATER ENERGY HARVESTING EQUIPMENT

(71) Applicants: AGENCY FOR DEFENSE DEVELOPMENT, Daejeon (KR); ANDONG NATIONAL UNIVERSITY INDUSTRY-ACADEMIC COOPERATION FOUNDATION, Andong-si (KR)

(72) Inventors: Chee-Young Joh, Daejeon (KR); Hee-Seon Seo, Daejeon (KR); Jong-Kil Lee, Andong-si (KR); Hyun-Du Jin, Andong-si (KR); Jin-Hyo Ahn, Andong-si (KR)

(73) Assignees: Agency for Defense Development, Daejeon (KR); Andong National University Industry-Academic Cooperation Foundation, Andong-si (KR)

( * ) Notice: Subject to any disclaimer, the term of this patent is extended or adjusted under 35 U.S.C. 154(b) by 472 days.

(21) Appl. No.: 16/789,937

(22) Filed: Feb. 13, 2020

(65) Prior Publication Data
US 2020/0313575 A1 Oct. 1, 2020

(30) Foreign Application Priority Data
Feb. 14, 2019 (KR) .......... 10-2019-0017023

(51) Int. Cl.
*H02N 2/18* (2006.01)
*F03B 13/10* (2006.01)
(Continued)

(52) U.S. Cl.
CPC ............. *H02N 2/185* (2013.01); *F03B 13/10* (2013.01); *H02N 2/188* (2013.01); *H01L 41/183* (2013.01); *H01L 41/193* (2013.01)

(58) Field of Classification Search
CPC ...... H02N 2/185; H02N 2/188; H01L 41/193; F03B 13/10
See application file for complete search history.

(56) References Cited

U.S. PATENT DOCUMENTS 4,387,318 A * 6/1983 Kolm .................. F03D 5/00
310/330
10,153,713 B2 * 12/2018 Petroni ................. H02N 2/185
(Continued)

OTHER PUBLICATIONS

Office Action of Korean Patent Application No. 10-2019-0017023—10 pages (dated Jan. 21, 2020).
(Continued)

*Primary Examiner* — J. San Martin
(74) *Attorney, Agent, or Firm* — Knobbe, Martens, Olson & Bear, LLP

(57) ABSTRACT

A funnel-shaped underwater energy harvesting equipment includes a piezoelectric element configured to be installed at a seabed and to be moved by a fluid in order to convert vibration energy into electricity. The funnel-shaped underwater energy harvesting equipment further includes a fluid collector coupled to the piezoelectric element and configured to increase velocity of the fluid flowing toward the piezoelectric element. The harvesting equipment exhibits improved energy conversion efficiency, while simplifying the shape of the harvesting equipment.

8 Claims, 7 Drawing Sheets

(51) Int. Cl.
 *H01L 41/18* (2006.01)
 *H01L 41/193* (2006.01)

(56) References Cited

U.S. PATENT DOCUMENTS

2013/0119669 A1* 5/2013 Murphree .............. H02N 2/185
 290/54
2014/0319970 A1* 10/2014 Sherrit .................. H02N 2/185
 310/339

OTHER PUBLICATIONS

Final Office Action of Korean Patent Application No. 10-2019-0017023—6 pages (dated Oct. 19, 2020).
Cha et al., "Energy harvesting from underwater base excitation of a piezoelectric composite beam", Smart Materials and Structures, vol. 22—15 pages (dated Oct. 17, 2013).
Giacomello et al., "Underwater energy harvesting from a heavy flag hosting ionic polymer metal composites," *J. of Applied Physics*, 109, 2011.
Shan et al., "Novel Energy Harvesting: A Macro Fiber Composite Piezoelectric Energy Harvester in the Water Vortex," vol. 41, supply 1, 2015, pp. S763-S767.
Song et al., "A study of vortex-induced energy harvesting from water using PZT piezoelectric cantilever with cylindrical extension," *Ceramics International*, 41, 2015, pp. S768-S773.

* cited by examiner

FUNNEL-SHAPED UNDERWATER ENERGY HARVESTING EQUIPMENT

CROSS-REFERENCE TO RELATED APPLICATION

This present application claims benefit of priority to Korean Patent Application No. 10-2019-0017023, entitled "FUNNEL-SHAPED UNDERWATER ENERGY HARVESTING EQUIPMENT," filed on Feb. 14, 2019, in the Korean Intellectual Property Office, the entire disclosure of which is incorporated herein by reference.

BACKGROUND

1. Technical Field

The present disclosure relates to an underwater energy harvesting equipment capable of converting underwater mechanical energy into electrical energy and storing the electrical energy.

2. Description of Related Technology

In order to secure reliability and long-term operability in a present and future underwater sound network system, it is essential to stably supply power to various kinds of sensor nodes. In recent years, research has been actively conducted into energy harvesting technology for acquiring vibration energy caused by flow of a fluid present in an ocean environment in which a sensor network is actually operated and supplying the acquired vibration energy to the sensor nodes, which is very important for military purposes.

Underwater energy harvesting methods using various principles have been proposed. One of the proposed underwater energy harvesting methods is an energy harvesting method using piezoelectric energy. Piezoelectric energy harvesting refers to technology for converting mechanical energy generated in an ambient environment, such as microscale vibration, pressure, or impact, into electrical energy and a series of processes for storing and efficiently utilizing the electrical energy. This technology is a field into which research has been the most actively conducted, among recent microenergy harvesting technologies. As the result of such research, commercial products having a high degree of perfection have already come onto the market in North America and Europe; however, the small amount of power generated by the vibration energy harvesting equipment and dependence of the generated power on excitation frequency are still to be overcome.

SUMMARY

The present disclosure has been made in view of the above problems, and it is an aspect of the present disclosure to provide an underwater energy harvesting equipment that has a simple shape and exhibits high energy conversion efficiency.

A funnel-shaped underwater energy harvesting equipment according to an embodiment of the present disclosure includes a piezoelectric element installed at a seabed, the piezoelectric element being configured to be moved by a fluid in order to convert vibration energy into electricity, and a fluid collector coupled to the piezoelectric element, the fluid collector being configured to increase velocity of the fluid flowing toward the piezoelectric element.

The piezoelectric element may be configured such that polyvinylidene fluoride (PVDF) or macro fiber composite (MFC) is attached to a flexible plate.

The fluid collector may include an outlet portion fixedly coupled to the piezoelectric element, the outlet portion having therein a through-hole configured to allow the fluid to flow therethrough, and a wing-shaped inlet portion formed so as to extend from the outlet portion, the wing-shaped inlet portion having a shape extending in a direction gradually distant from the piezoelectric element.

The wing-shaped inlet portion may have a shape formed so as to be gradually bent outwards toward the ends thereof.

The piezoelectric element may be coupled to a cable connected to a sensor node having one side fixedly installed at the surface of the seabed in order to construct an underwater sensor network.

A funnel-shaped underwater energy harvesting equipment according to another embodiment of the present disclosure includes a cable connected to a sensor node fixedly installed at the surface of a seabed in order to construct an underwater sensor network, a piezoelectric element having one side coupled to the cable, the piezoelectric element being configured to be moved by a fluid in order to convert vibration energy into electricity, and a fluid collector coupled to the piezoelectric element, the fluid collector being configured to increase velocity of the fluid flowing toward the piezoelectric element.

BRIEF DESCRIPTION OF THE DRAWINGS

The above and other aspects, features, and advantages of the present disclosure will become apparent from the detailed description of the following aspects in conjunction with the accompanying drawings.

DETAILED DESCRIPTION

The present disclosure relates to a piezoelectric energy harvester using a vibration phenomenon of an underwater cable. The result of analysis on domestic and foreign technology status reveals that underwater cable vibration type energy harvesters are mainly classified into a flag type energy harvester, a vortex vibration type energy harvester, and a cantilever type energy harvester; however, it is difficult to search for research results of experiments performed in the state in which the energy harvester is actually fixed to the surface of the seabed or floats.

Figure 1A:
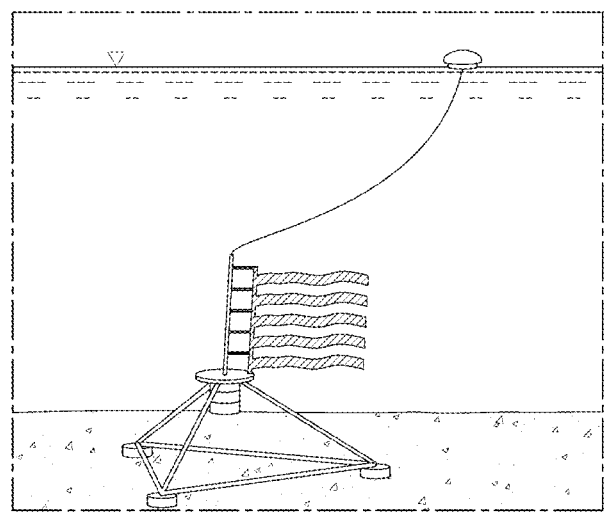
FIGS. 1A to 4 are views showing example underwater energy harvesting technology.

As a recent one of the conventional technologies, Shan et al. reported the result of performance of a macro fiber composite (MFC)-based energy harvesting equipment using an environment having an underwater vortex (Shan, X. et al., 2015, Novel Energy Harvesting: A Macro Fiber Composite Piezoelectric Energy Harvester in the Water Vortex, Vol. 41, Supply. 1, pp. 5763-5767). A mathematical model of an energy harvesting equipment using a piezoelectric material in a vortex environment was constructed, energy generation performance was predicted, the theoretical analysis result and the experimental result in performance of the energy harvesting equipment based on the velocity of a fluid, etc. were compared, and coincidence therebetween was confirmed. FIG. 1A shows such an underwater energy harvesting experiment equipment.

Figure 1B:
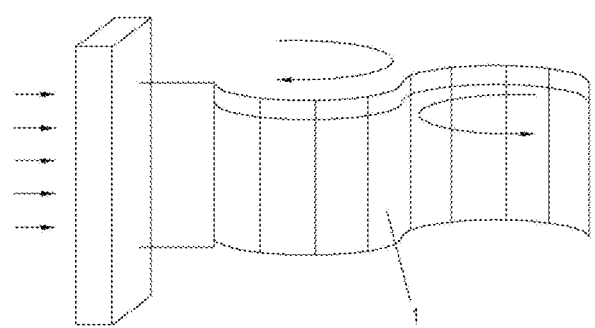

This research reveals that, in the case in which a vortex is generated using a cylinder having a diameter of 30 mm at an output density of 1.1 mW/m2 and a fluid velocity of 0.5 m/s, it is possible to generate a maximum of 1.32 µW of energy. The energy harvesting equipment uses fluctuation of a fluid caused by a long piezoelectric polymer strip, in a manner similar to motion of an eel that swims as shown in FIG. 1B. In a non-turbulent flow, a rotation generator 1 alternately generates a vortex by the magnitude of a frequency corresponding to regular velocity and width of the fluid at opposite ends thereof. As the result of a pressure difference caused by such a vortex, vibration energy is generated at the tail of the energy harvesting equipment. In consequence, deformation of a piezoelectric polymer generates a low-frequency alternating-current voltage signal. The generated voltage is converted into direct current in order to charge a battery of a remote sensor.

Figure 2:
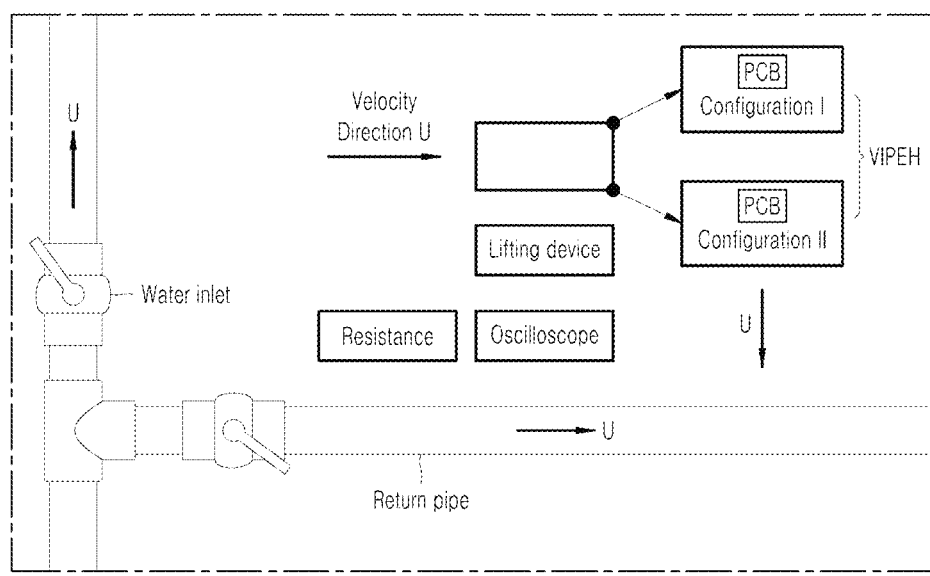
Figure 3:
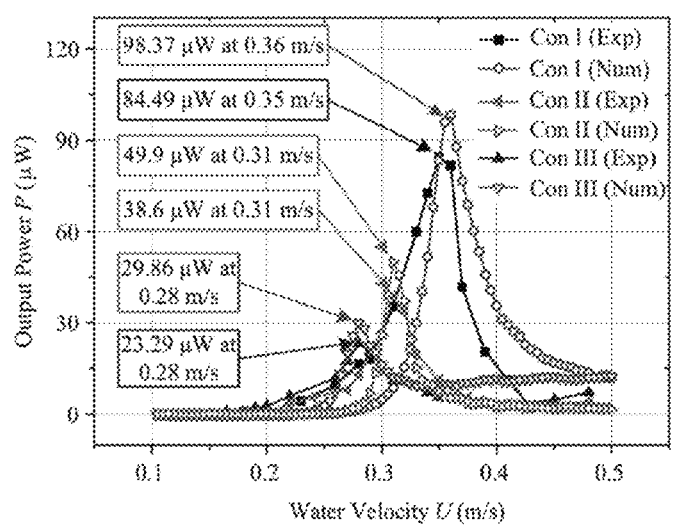

Song et al. studied underwater vortex-induced energy harvesting technology (R. Song, X. Shan, F. Lv, T. Xie, "A study of vortex-induced energy harvesting from water using PZT piezoelectric cantilever with cylindrical extension," Ceramics International, 41, S768-S773, 2015). They manufactured a piezoelectric cantilever, and conducted an underwater experiment on the same. A prototype of a VIPEH is manufactured so as to have a piezoelectric cantilever with a cylindrical extension. A PCB is manufactured by bonding PZT and copper to each other using epoxy. A cylinder is submerged in water by Lf=50 mm. With an increase in water temperature, the frequency of a vortex gradually becomes approximate to the natural frequency of the VIPEH. In the case which the frequency of the vortex coincides with the natural frequency of the VIPEH, drag from the vortex resonates the cylinder and increases the amplitude of vibration of the cylinder. In this study, an examination was made into whether the vertical VIPEH manufactured using the piezoelectric cantilever beam and the cylinder is capable of harvesting hydraulic energy. An Euler-Bernoulli model was established therethrough, and appropriateness of this model was verified through experimentation. FIG. 2 shows the above-described experiment equipment. In addition, an aspect in which an increase in mass M and an increase in diameter D improve energy harvesting ability of the VIPEH was assumed.

Figure 4:
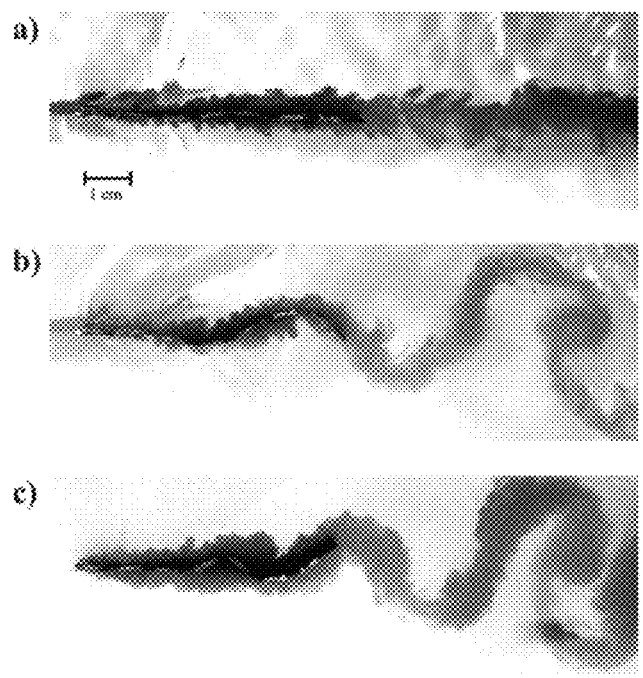
Figure 5:
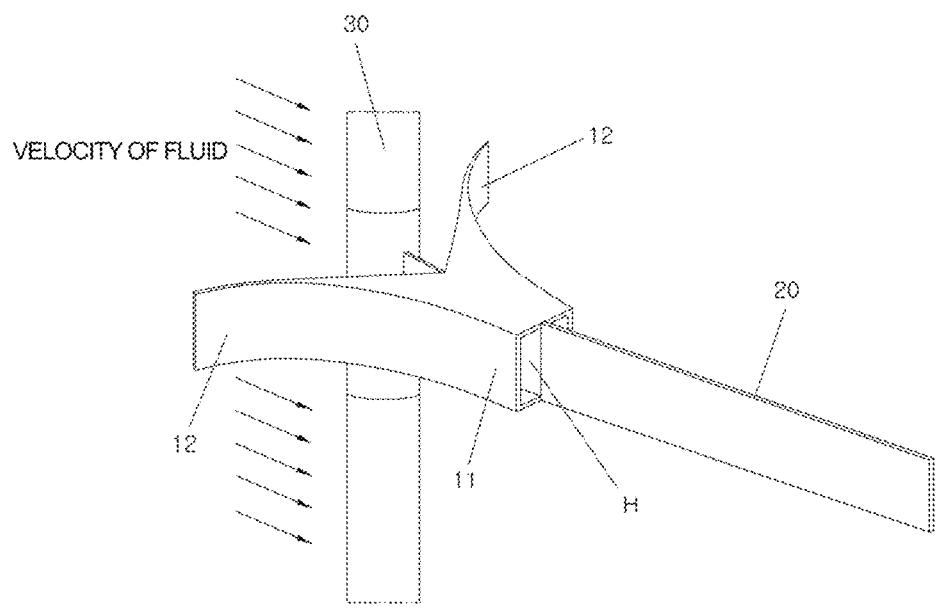
FIG. 5 is a view showing a funnel-shaped underwater energy harvesting equipment according to some embodiments of the present disclosure.

In addition, as shown in FIGS. 4 and 5, Giacomello et al. conducted analysis on the flow of a fluid and visual experimentation on the flow of a vortex (A. Giacomello. M. Porfiri, "Underwater energy harvesting from a heavy flag hosting ionic polymer metal composites," J. of Applied Physics, 109, 2011). A dye is injected into a small tube immediately above a flag in order to show a change in a striped pattern that appears on the front edge of the flag. This indicates the position of a sheet on which a vortex is generated. In this research, the flow of the fluid around the flag by velocity and a vibration phenomenon of the flag were experimentally analyzed, and a critical velocity of the fluid at which the flag is uniformly vibrated was compared with a theoretical value.

Although various underwater energy harvesting methods have been proposed, as described above, many restrictions are still present. For example, a buoy type vibration energy harvester, which is based on technology that has been typically researched, has problems in that the vibration energy harvester is large and heavy, since a linear power generation system is mainly used.

Meanwhile, in terms of an energy conversion mechanism, a representative piezoelectric type energy harvester converts large deformation mainly caused by resonance into electrical energy. In order to improve conversion efficiency and to increase the amount of electric power that is generated, therefore, a design for effectively reflecting the vibration characteristics of a structure according to an external environment (available frequency, acceleration, etc.) is important.

The background art described above may be technical information retained by the present inventors in order to derive the present disclosure or acquired by the present inventors along the process of deriving the present disclosure, and thus is not necessarily a known art disclosed to the general public before the filing of the present application.

Advantages and features of the present disclosure and methods for achieving the same will become apparent from the descriptions of aspects herein below with reference to the accompanying drawings. However, the present disclosure is not limited to the aspects disclosed herein but may be implemented in various different forms. The aspects are provided to make the description of the present disclosure thorough and to fully convey the scope of the present disclosure to those skilled in the art. It is to be noted that the scope of the present disclosure is defined only by the claims.

In relation to describing the present disclosure, when the detailed description of the relevant known technology is determined to unnecessarily obscure the gist of the present disclosure, the detailed description may be omitted.

Figure 6A:
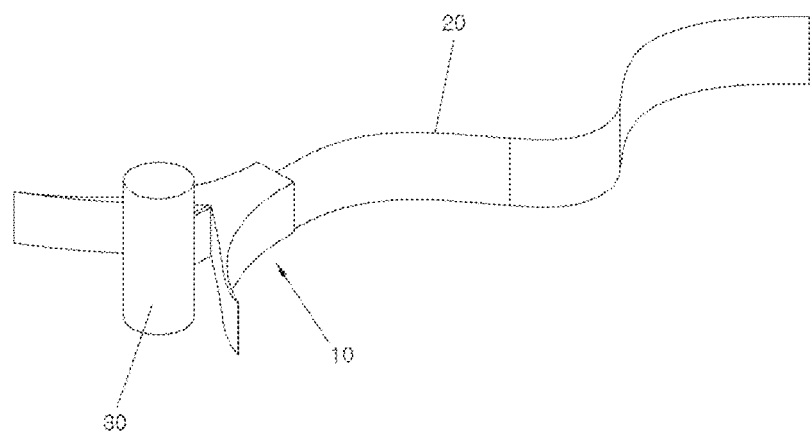
FIG. 6A is a view showing the operation state of the funnel-shaped underwater energy harvesting equipment according to some embodiments of the present disclosure.
Figure 6B:
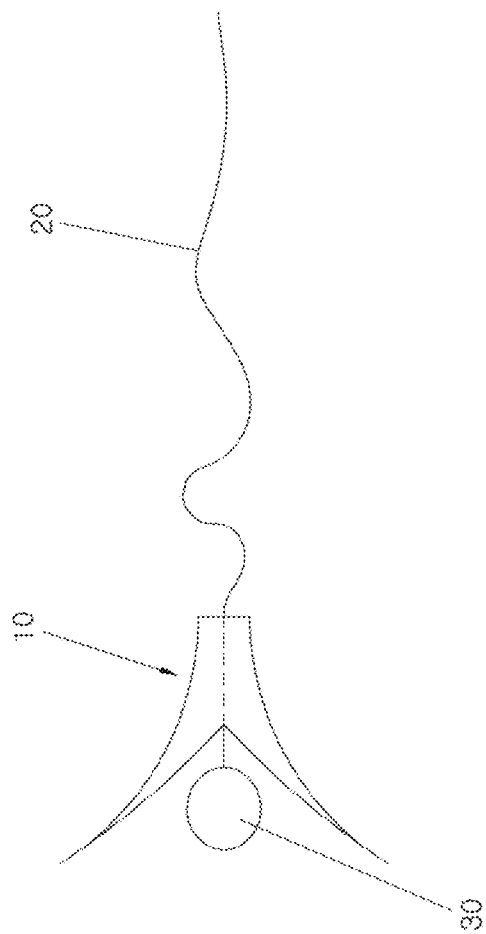
FIG. 6B is a view showing the planar shape of FIG. 6A.

FIG. 5 is a view showing a funnel-shaped underwater energy harvesting equipment according to the present disclosure, FIG. 6A is a view showing the operation state of the funnel-shaped underwater energy harvesting equipment according to the present disclosure, and FIG. 6B is a view showing the planar shape of FIG. 6A.

Hereinafter, a funnel-shaped underwater energy harvesting equipment according to an embodiment of the present disclosure will be described with reference to FIGS. 5 to 6B.

The funnel-shaped underwater energy harvesting equipment according to the present disclosure is an equipment that harvests energy using flow-induced vibration of a cable 30 connected to a sensor node fixedly installed at the surface of a seabed in order to construct an underwater sensor network, the flow-induced vibration of the cable being caused by the flow of a fluid.

That is, the funnel-shaped underwater energy harvesting equipment according to the present disclosure is based on the principle by which generation of a vortex flow due to flow-induced vibration is increased to accelerate vibration of a piezoelectric element, thereby harvesting piezoelectric energy.

As shown, the funnel-shaped underwater energy harvesting equipment according to the present disclosure includes a fluid collector 10 and a piezoelectric element 20.

The piezoelectric element 20 may be made of polymer-type polyvinylidene fluoride (PVDF) or fiber-type composite, such as macro fiber composite (MFC), by which piezoelectric efficiency may be improved.

As shown, polyvinylidene fluoride (PVDF) or macro fiber composite (MFC) may be attached to a plate manufactured so as to have the structure of a thin flexible plate such that vibration of the plate caused by generation of the vortex flow is transmitted to a piezoelectric material in order to harvest energy.

One side of the piezoelectric element 20 is coupled to the cable 30, which is installed at the seabed.

The fluid collector 10 includes an outlet portion 11 and a wing-shaped inlet portion 12.

The outlet portion 11 corresponds to the outlet side of a fluid and is fixedly coupled to the piezoelectric element 20, and the wing-shaped inlet portion 12 corresponds to the inlet side of the fluid.

The fluid flows along a through-hole H formed in the outlet portion 11 through the inside of the wing-shaped inlet portion 12 in order to move the piezoelectric element 20.

The wing-shaped inlet portion 12 is formed so as to extend from the outlet portion 11, and has a shape extending in a direction gradually distant from the piezoelectric element 20.

Furthermore, the wing-shaped inlet portion 12 has a shape formed so as to be gradually bent outwards toward the ends thereof, whereby it is possible to further concentrate the fluid.

That is, since the fluid collector 10 is formed so as to have a funnel shape, the velocity of the fluid introduced through the wing-shaped inlet portion 12 increases according to Bernoulli's equation while the fluid flows to the outlet portion 1, the area of the section of which perpendicular to the flow of the fluid is reduced, and therefore high velocity of the fluid on the outlet side accelerates generation of the vortex flow, whereby vibration of the piezoelectric element 20 is accelerated.

Figure 7:
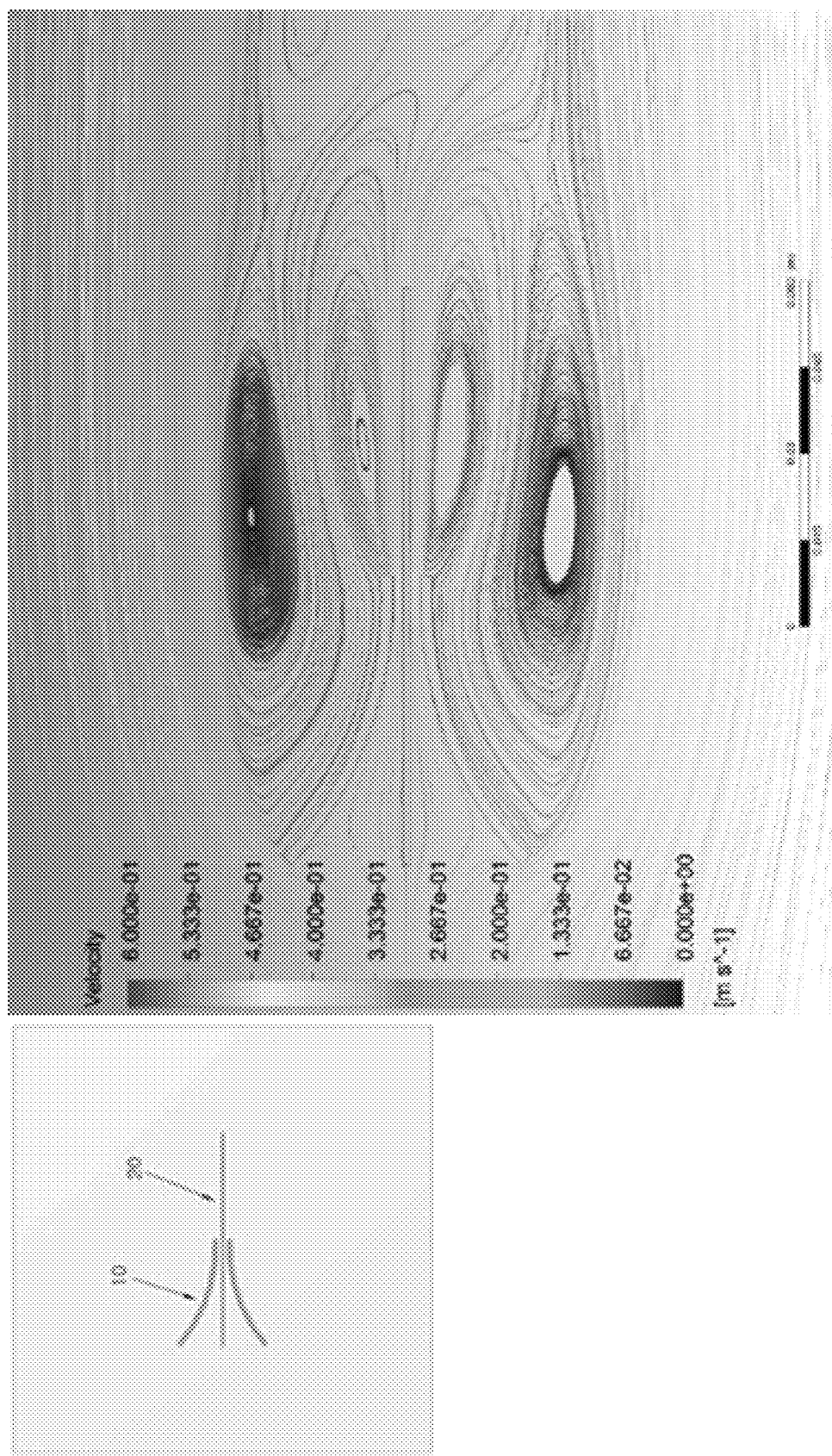
FIG. 7 is a view showing an example of ambient velocity distribution and vortex generation by the funnel-shaped underwater energy harvesting equipment according to the present disclosure.

FIG. 7 shows distribution of velocity around the harvesting equipment in the case in which the velocity of the fluid on the inlet side is 0.24 m/s, and it can be seen that the velocity in the fluid collector 10 is greatly increased.

Figure 8:
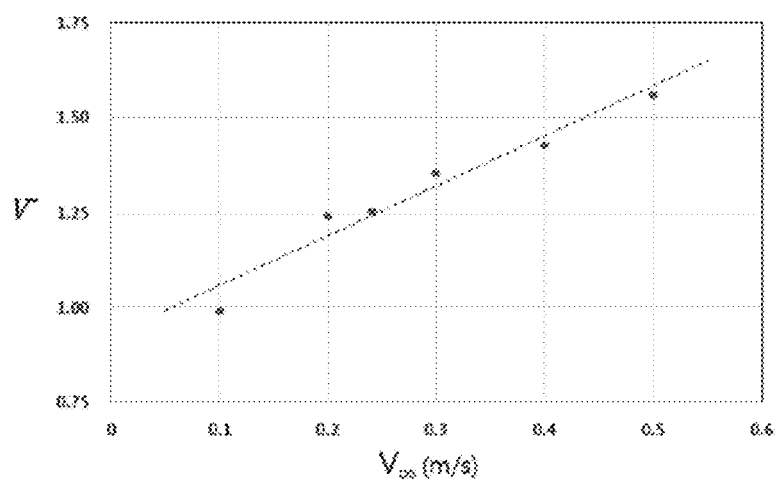
FIG. 8 is a view showing an increase change in velocity in a fluid collector depending on a change in inflow velocity of a fluid.

FIG. 8 is a graph showing a change in velocity of the fluid in funnel-shaped underwater energy harvesting equipment according to the present disclosure, and it can be seen that a change in velocity of the fluid increases as the velocity of the fluid increases.

As is apparent from the above description, the funnel-shaped underwater energy harvesting equipment according to the present disclosure exhibits more improved energy conversion efficiency although the shape of the harvesting equipment is simple.

The funnel-shaped underwater energy harvesting equipment according to the present disclosure is based on the technology in which the harvesting equipment, which has a simple shape, is installed at a cable connected to a sensor node fixed to the surface of a seabed in order to harvest cable vibration energy caused by the flow of a fluid.

In particular, since a funnel-shaped fluid collector is used, it is possible achieve higher piezoelectric energy conversion efficiency than a conventional underwater cable vibration type energy harvester, and it is possible to simplify a manufacturing process and to reduce manufacturing cost due to the simple shape thereof.

In addition, extensibility through improvement in shape of the fluid collector is high, and a piezoelectric element applied to a flag may be made of various materials, whereby it is possible to improve piezoelectric efficiency.

The present disclosure described as above is not limited by the aspects described herein and the accompanying drawings. It should be apparent to those skilled in the art that various substitutions, changes and modifications which are not exemplified herein but are still within the spirit and scope of the present disclosure may be made. Therefore, the scope of the present disclosure is defined not by the detailed description, but by the claims and their equivalents, and all variations within the scope of the claims and their equivalents are to be construed as being included in the present disclosure.

What is claimed is:

1. A funnel-shaped underwater energy harvesting equipment comprising:
    a piezoelectric element configured to be moved by a fluid in order to convert vibration energy into electricity; and
    a fluid collector comprising an inlet portion configured to receive the fluid and an outlet portion configured to discharge the fluid, the fluid collector comprising a fluid channel between the inlet portion and the outlet portion, the fluid collector configured to increase velocity of the fluid flowing toward the piezoelectric element,
    the piezoelectric element passing through the fluid collector and comprising:
        a first portion configured to be fixed and disposed between the inlet and outlet portions of the fluid collector; and
        a second portion extending from the first portion in a direction of the fluid flowing, the second portion of the piezoelectric element located outside the fluid channel of the fluid collector and configured to be moved by the fluid flowing out of the fluid channel of the fluid collector through the outlet portion.

2. The funnel-shaped underwater energy harvesting equipment according to claim 1, wherein the piezoelectric element is configured such that polyvinylidene fluoride (PVDF) or macro fiber composite (MFC) is attached to a flexible plate.

3. The funnel-shaped underwater energy harvesting equipment according to claim 1,
    wherein the outlet portion is fixedly coupled to the piezoelectric element, the outlet portion having therein a through-hole configured to allow the fluid to flow therethrough, and
    wherein the inlet portion is wing-shaped, the wing-shaped inlet portion having a shape extending in a direction in which the distance between the wing-shaped inlet portion and the piezoelectric element gradually increases.

4. The funnel-shaped underwater energy harvesting equipment according to claim 3, wherein the wing-shaped inlet portion has a shape formed so as to be gradually bent outwards toward ends thereof.

5. The funnel-shaped underwater energy harvesting equipment according to claim 3, wherein the piezoelectric element is coupled to a cable connected to a sensor node having one side fixedly installed at a surface of the seabed in order to construct an underwater sensor network.

6. A funnel-shaped underwater energy harvesting equipment comprising:
    a cable connected to a sensor node configured to be fixedly installed at a surface of a seabed in order to construct an underwater sensor network;
    a piezoelectric element having one side coupled to the cable, the piezoelectric element configured to be moved by a fluid in order to convert vibration energy into electricity; and
    a fluid collector comprising an inlet portion configured to receive the fluid and an outlet portion configured to discharge the fluid, the fluid collector comprising a fluid channel between the inlet portion and the outlet portion, the fluid collector configured to increase velocity of the fluid flowing toward the piezoelectric element, the piezoelectric element passing through the fluid collector and comprising:
- a first portion configured to be fixed and disposed between the inlet and outlet portions of the fluid collector; and
- a second portion extending from the first portion in a direction of the fluid flowing, the second portion of the piezoelectric element located outside the fluid channel of the fluid collector and configured to be moved by the fluid flowing out of the fluid channel of the fluid collector through the outlet portion.

7. The funnel-shaped underwater energy harvesting equipment according to claim 1, wherein the outlet portion of the fluid collector comprises a through-hole through which the piezoelectric element passes.

8. The funnel-shaped underwater energy harvesting equipment according to claim 7, wherein the through-hole comprises a first through-hole disposed on a first side of the piezoelectric element and a second through-hole disposed on a second side of the piezoelectric element opposing the first side.

\* \* \* \* \*